United States Patent
Yao et al.

(10) Patent No.: US 7,410,854 B2
(45) Date of Patent: Aug. 12, 2008

(54) METHOD OF MAKING FUSI GATE AND RESULTING STRUCTURE

(75) Inventors: Liang-Gi Yao, Hsin-Chu (TW);
Hun-Jan Tao, Hsin-Chu (TW);
Shih-Chang Chen, Hsin-Chu (TW);
Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 11/543,410

(22) Filed: Oct. 5, 2006

(65) Prior Publication Data

US 2008/0085590 A1    Apr. 10, 2008

(51) Int. Cl.
*H01L 21/336*    (2006.01)
*H01L 21/8234*   (2006.01)

(52) U.S. Cl. .................. 438/197; 438/663; 438/692; 438/680; 438/311; 257/E21.17; 257/E21.32; 257/E21.082; 257/E21.231; 257/E21.416; 257/E21.304

(58) Field of Classification Search .......... 438/197, 438/199, 311, 506, 510, 663, 647, 657, 680, 438/682, 740, 775, 692, 753, 933, 942, 954, 438/706, 745
See application file for complete search history.

(56) References Cited

U.S. PATENT DOCUMENTS 6,204,103 B1 * 3/2001 Bai et al. .................... 438/224
6,232,227 B1 * 5/2001 Mikagi ....................... 438/655
6,465,309 B1 * 10/2002 Xiang et al. ................ 438/299
6,642,119 B1 * 11/2003 Pelella et al. ............... 438/303
6,905,922 B2   6/2005 Lin et al.
7,122,472 B2 * 10/2006 Fang et al. .................. 438/664
2001/0009791 A1 * 7/2001 Ahmad et al. ............... 438/300
2004/0065930 A1 * 4/2004 Lin et al. .................... 257/412

OTHER PUBLICATIONS

IEEE, 4 ages, 2005, USA, Lauwers.*
Anil, K. G., et al., "CMP-less integration of Fully Ni-Silicided Metal Gates in FinFETs by simultaneous silicidation of the source, drain, and the gate using a novel dual hard mask approach," 2005 Symposium on VLSI Technology Digest of Technical Papers, pp. 198-199.
Kittl, J. A., et al., "Scalability of Ni FUSI gate processes: phase and Vt control to 30 nm gate lengths," 2005 Symposium on VLSI Technology Digest of Technical Papers, pp. 72-73.
Lauwers, A., et al., "CMOS Integration of Dual Work Function Phase Controlled Ni FUSI with Simultaneous Silicidation of NMOS (NiSi) and PMOS (Ni-rich silicide) Gates on HfSiON," 2005 IEEE, 4 pgs.

* cited by examiner

*Primary Examiner*—David Nhu
(74) *Attorney, Agent, or Firm*—Slater & Matsil, L.L.P.

(57) ABSTRACT

Generally disclosed is a method of a device comprising forming a polysilicon stack including a first and a second polysilicon layer with an intervening etch stop layer, wherein the first polysilicon layer height is at least one third a height of the polysilicon stack height, removing the second polysilicon layer and the etch stop layer, and reacting the first polysilicon layer with a metal to fully silicide the first polysilicon layer. Fully silicided (FUSI) gates can hence be formed with uniform gate height. The thin first polysilicon layer allows for siliciding with a lower thermal budge and with better uniformity of the silicide concentration throughout the layer.

20 Claims, 8 Drawing Sheets

METHOD OF MAKING FUSI GATE AND RESULTING STRUCTURE

RELATED APPLICATION

This application is related to co-pending patent application entitled "Method of Making FUSI Gate and Resulting Structure," Ser. No. 11/583,491, filed Oct. 18, 2006, which application is incorporated herein by reference.

TECHNICAL FIELD

This invention relates generally to semiconductor devices, and more particularly to semiconductor devices with gate electrodes formed by silicidation.

BACKGROUND OF THE INVENTION

As integrated circuit device geometries continue to shrink deep into the sub-micron realm, new technologies must be employed to maintain desirable device performance. Gate engineering for MOSFET devices is an area of intense interest and research. One such area is in the employment of fully silicided gate electrodes, or so-called FUSI gate electrodes.

While FUSI gate electrodes allow for greater flexibility in, e.g., tuning work function performance, they introduce manufacturing and design difficulties that must be overcome. What is needed, therefore, is an improved FUSI structure and method of making same that overcomes shortcomings in the prior art.

SUMMARY OF THE INVENTION

In one aspect, the present invention provides for a method of forming a device. The method includes forming a polysilicon stack including a first and a second polysilicon layer with an intervening etch stop layer, wherein the first polysilicon layer height is at least one third a height of the polysilicon stack height. The method further includes removing the second polysilicon layer and the etch stop layer; and reacting the first polysilicon layer with a metal to substantially fully silicide the first polysilicon layer.

In another aspect, the present invention provides for a method of forming a transistor. The method includes forming on a substrate a gate stack including a gate dielectric, a first polysilicon layer, an etch stop layer, and second polysilicon layer, wherein the first polysilicon layer has a height of about one third to about eighty percent of the gate stack height. The method further includes forming at least partly in the substrate source and drain regions, respectively, on opposite sides of the gate stack and siliciding at least a portion of a top surface of the source and drain regions. The method further includes covering the source and drain regions and exposing a top surface of the gate stack, removing the second polysilicon layer and the etch stop layer, and substantially fully siliciding the first polysilicon layer.

BRIEF DESCRIPTION OF THE FIGURES

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. In fact, certain features of the illustrations are exaggerated in relative size in order to more clearly illustrate those and other features. To more clearly illustrate certain embodiments, a letter indicating variations of the same structure, material, or process step may follow a reference number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A first exemplary method of forming FUSI gate structure is illustrated with reference to FIGS. 1 through 7. Beginning with FIG. 1, a wafer 2 is illustrated in which have been formed isolation structures 4, such as shallow trench isolation structures well known in the art. Only one such structure is shown, although as will be clear to one skilled in the art, numerous such structures will be formed in a typical integrated circuit device. A highly simplified example is provided in the figure, in which a PMOS device will be fabricated in region 1 on one side of isolation structure 4 and an NMOS device will be fabricated in region 3 on the other side of isolation structure 4. Wafer 2 is illustratively a bulk silicon wafer, a silicon on insulator (SOI) wafer, silicon on sapphire (SOS) or other substrate compatible with integrated circuit manufacturing. In yet other embodiments, wafer 2 may comprise different materials. For instance, portions of wafer 2, particularly source/drain regions may be formed of, e.g., Si—Ge.

Figure 1:
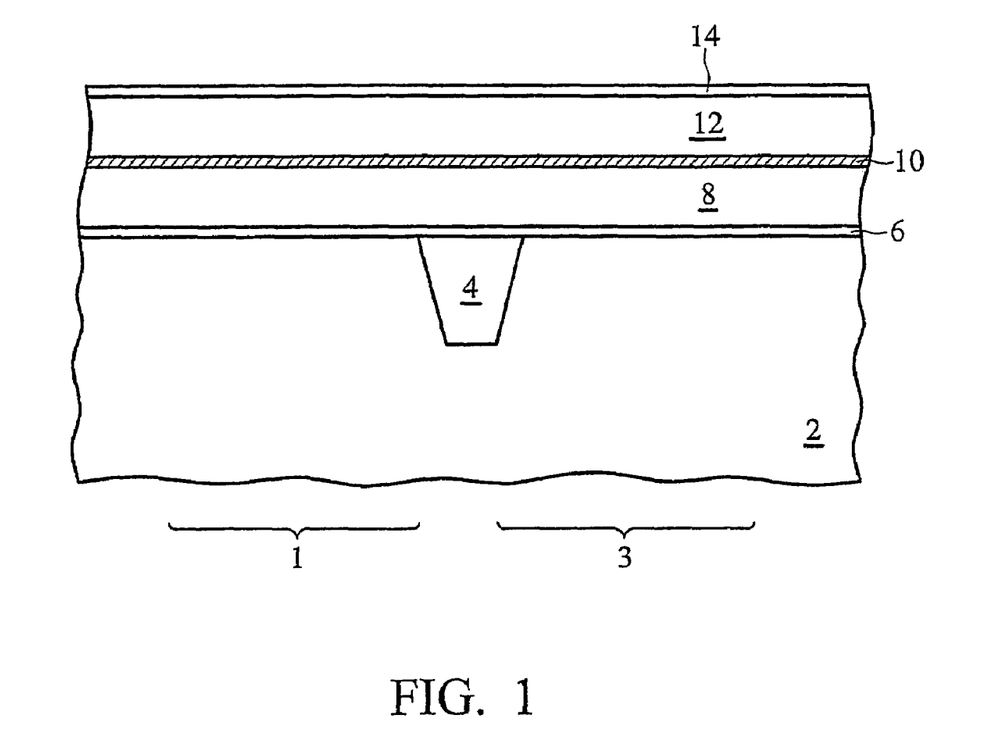
FIGS. 1 through 7 illustrate in cross-sectional view intermediate steps in a first illustrative method of forming a fully silicided gate electrode.

As shown, a gate dielectric layer 6 is formed on a top surface of substrate 2 and isolation structure 4. A first gate electrode layer 8, e.g., polysilicon or amorphous silicon, is formed atop gate dielectric layer 6. Etch stop layer 10 is formed atop polysilicon layer 8. A second gate electrode layer 12, e.g., polysilicon or amorphous silicon, is formed atop etch stop layer 10. Finally, hard mask layer 14 is formed atop second polysilicon layer 12. As will be shown in the following discussion, the above described stack of layers will be used in forming the respective gate stacks for the subsequently formed PMOS and NMOS devices, and may be called a gate stack or a polysilicon stack interchangeably in the following description.

Gate dielectric layer 6 is preferably a thermally grown oxide layer. The layer may, in some embodiments, be nitrided by exposing the oxide to a nitriding environment. Nitriding improves the dielectric characteristics of the oxide, but it also may decrease drive current by increasing the defect density near the surface of the (subsequently formed) device channel region, which defects operate as charge traps. Depending upon design constraints, gate dielectric layer 6 may range from about 10 Å to about 20 Å, although other thicknesses are within the contemplated scope of the invention. Alternatively, other dielectrics, including so-called high-k dielectrics such as $HfO_x$ and the like may be employed.

In an illustrative embodiment in which the gate stack is about 1,000 Å thick in total, polysilicon layer 8 may range from about 330 Å to as much as perhaps 800 Å thick. In other words, polysilicon layer 8 is preferably at least about one third the thickness of the total stack to about eighty percent of the total thickness. The total thickness, sometimes referred to herein as the total height, of the stack is typically around 800 Å to around 1,000 Å in the illustrative embodiments, although other heights are within the contemplated scope of the invention.

Etch stop layer 10 may be silicon oxide, silicon nitride, silicon oxynitride, or some other appropriate material. The selection of etch stop layer 10 material is a matter of design choice—the constraints being the material should be compatible with the CMOS process flow and should have high etch selectivity relative to polysilicon. The thickness of etch stop layer 10 is also a matter of design choice—the constraint being that etch stop layer 10 must be sufficiently thick so as to protect underlying polysilicon layer 8 during over-etching of overlying polysilicon layer 12, as will be discussed further below. In an illustrative embodiment, etch stop layer 10 is about 10 Å to about 50 Å thick.

Second polysilicon layer 12 is formed, similarly to first polysilicon layer 8, using conventional deposition techniques. The polysilicon layers could be doped in situ during deposition, although control and uniformity of dopant concentration is difficult to control. Preferably, the polysilicon layers are doped via conventional ion implantation doping after deposition. Masking may be employed to ensure optimum doping type and concentration levels for p-type devices and for n-type devices, respectively. In the illustrated embodiment in which the stack height is 1,000 Å, polysilicon layer 12 has a thickness of from about 200 Å to about 670 Å (recall that polysilicon layer 8 has a thickness of from about 330 Å to about 800 Å). For simplicity, the total gate stack height is taken as the combined thickness of polysilicon layers 8 and 12, and the thickness of etch stop layer 10 and gate dielectric layer 6 is ignored, as they do not contribute significantly to the overall stack height.

Hard mask 14 may comprise silicon oxide, silicon nitride, silicon oxynitride, or any other suitable material. Much like etch stop layer 10, the design constraints on the selection of hard mask 14 is that it is compatible with CMOS process flows and has high etch selectivity relative to polysilicon. In illustrative embodiments, hard mask layer 14 is preferably about 300 Å to about 800 Å and more preferably about 500 Å in thickness.

Hard mask layer 14 is patterned using conventional photolithographic techniques, such as by forming a photoresist layer (not shown) atop hard mask layer 14, patterning the photoresist layer, and using the patterned photoresist layer to pattern hard mask 14 in a subsequent etch step. Hard mask 14 is then used as a pattern when etching underlying layers 12, 10, and 8, using etching processes that are well known in the art. The resulting structure is shown in FIG. 2a.

Figure 2A:
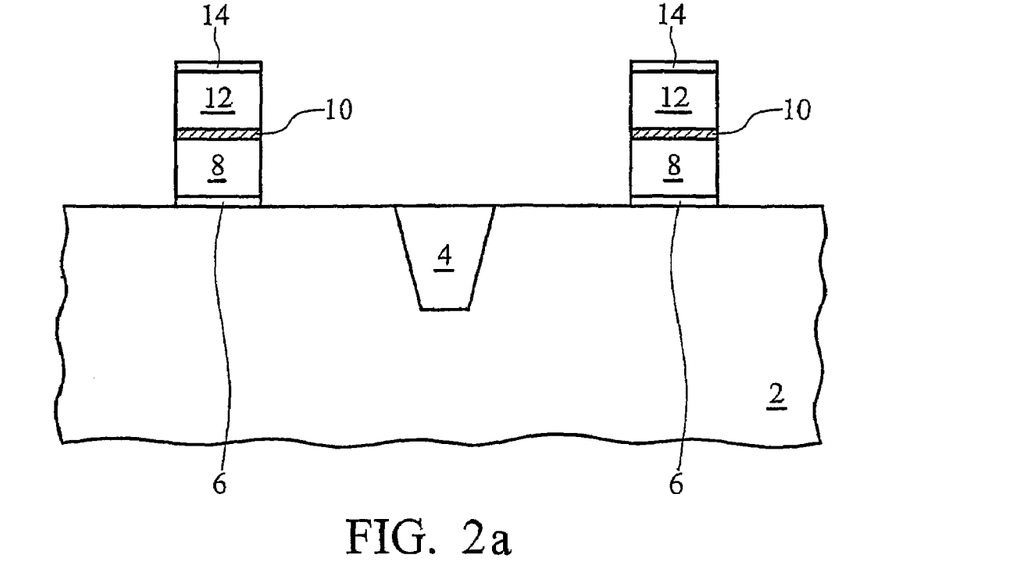
Figure 2B:
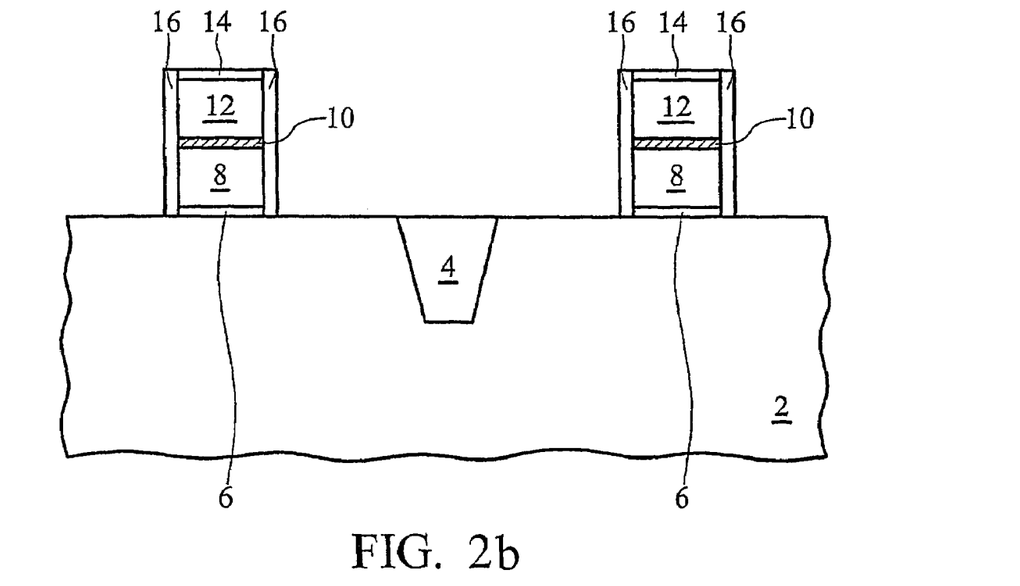

FIG. 2b illustrates an alternative embodiment. In this embodiment, after the stack is patterned, a thin nitride film is conformally deposited on the top surface of the structure, and then anisotropically etched back to remove the film from horizontal surface, while leaving the film remaining on vertical surfaces, such as the sidewalls of the respective stacks. The result is sealing spacers 16 as shown in FIG. 2b. As will become more clear below, sealing spacers 16 protect subsequently formed gate spacers from being attacked during etching of etch stop layer 10. The nitride film is preferably formed by CVD deposition for good conformal coverage to a thickness illustratively ranging from about 20 Å to about 80 Å.

In the illustrated embodiments, both gate stacks have polysilicon layer 8 of equal thickness. It is within the contemplated scope of the invention, however, that portions of polysilicon layer 8 (say region 1 of FIG. 1) could be thicker relative to other portions (say region 3 of FIG. 1), This would result in a first gate stack having a relatively thick polysilicon layer 8 and a second gate stack having a relatively thin polysilicon layer 8. As will be described in detail below, polysilicon layer 8 will become a fully silicided gate electrode. This means that some fully silicided gate electrode will be relatively thicker than others.

Figure 3A:
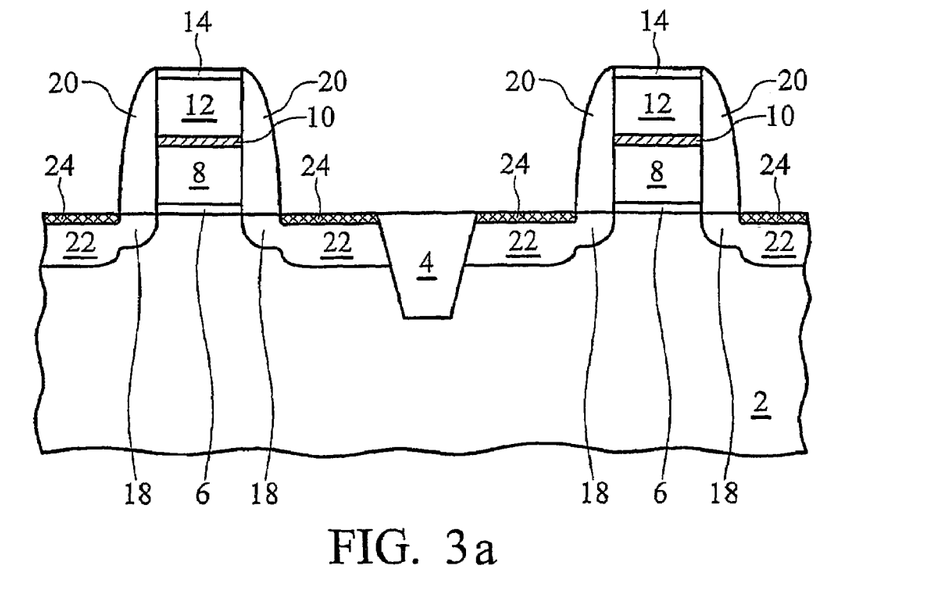
Figure 3B:
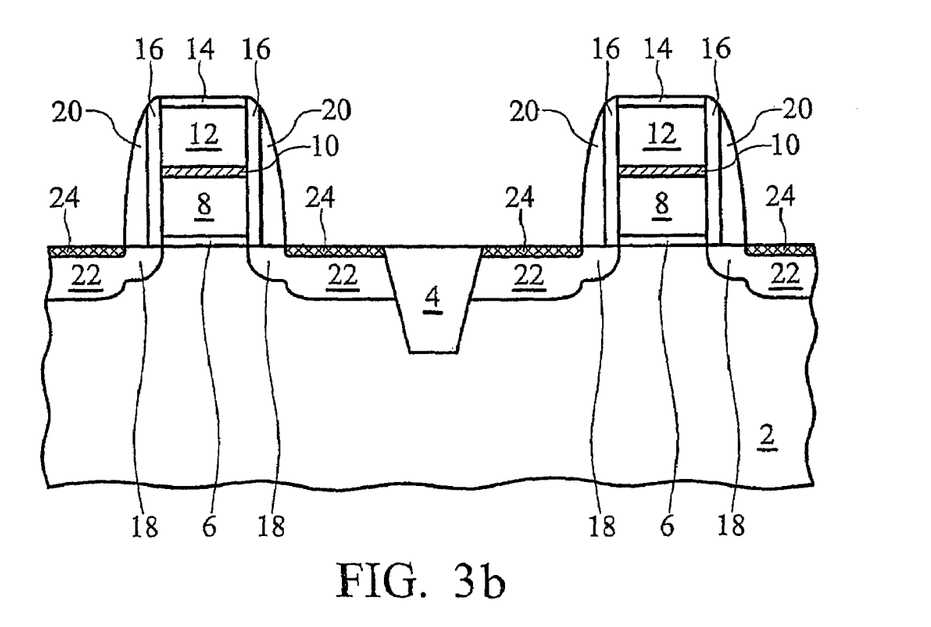

Turning now to FIGS. 3a and 3b, in which FIG. 3a corresponds to the embodiment of FIG. 2a and FIG. 3b corresponds to the embodiment of FIG. 2b. Source and drain regions are formed in substrate 2 using known CMOS process flows. In the illustrative embodiments, lightly doped source/drain regions 18 are first implanted substantially aligned with respective sidewalls of the respective stacks. Sidewall spacers 20 are formed on the sidewalls of the respective stacks (conformal deposition of one or more layers of oxide or nitride, followed by anisotropic etch of same) and source/drain regions 22 are implanted substantially aligned with the edges of the respective sidewall spacers. Obviously, several steps such as masking the PMOS device region when implanting n-type impurities into the NMOS device region and likewise masking the NMOS device region when implanting p-type impurities into the PMOS device region have been omitted for clarity of explanation. Likewise, one skilled in the art will recognize numerous variations from the described structure, including further graded junctions, multiple sidewall spacer schemes, halo implants, pocket implants, and the like that are not necessary for understanding the invention, but that are nonetheless within the contemplated scope of embodiments of the invention. In some embodiments, Si—Ge or like material may be epitaxially grown in recesses formed in wafer 2 as part of the formation of the source/drain regions. Source and drain silicide regions 24 are also shown in FIGS. 3a and 3b. Note that, unlike convention process flows in which gate silicide regions are formed simultaneously with source and drain regions, in the illustrative embodiments, the polysilicon layers 12 are not silicided (due to the presence of hard mask layer 14) for reasons that will become apparent below.

Figure 4A:
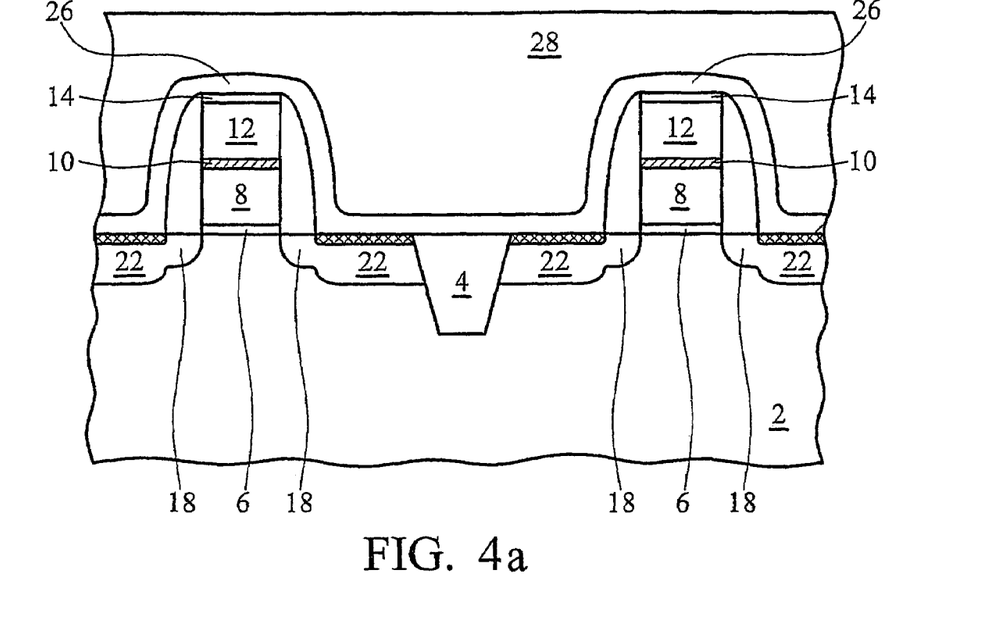
Figure 4B:
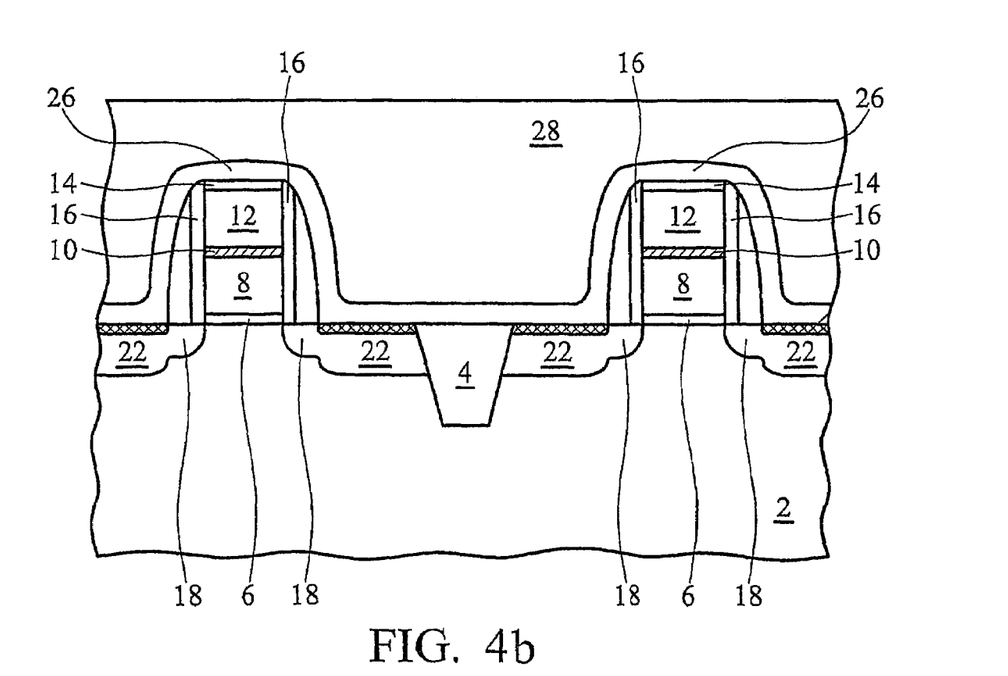

FIGS. 4a and 4b illustrate the formation of a protection layer 26 over the device. Protection layer 26 is illustratively a conformally deposited layer such as silicon nitride, with high selectively relative to polysilicon. In illustrative embodiments, protection layer 26 is deposited by a CVD process for good conformal coverage to a thickness of perhaps 20 Å to about 200 Å. Depending upon design choice, protection layer 26 may be deposited in such a manner as to protect S/D silicides during subsequent process.

After formation of protection layer 26, layer 28 is blanket deposited over the device, also as shown in FIGS. 4a and 4b. In the illustrative embodiments, layer 28 is an un-patterned photoresist layer, such as a polymer photoresist material. Layer 28 is thick, relative to protection layer 26. Using a conventional ashing or similar process, photoresist layer 28 is etched back to the point where the portions of protection layer 26 are exposed. Then, using a wet etch or other appropriate process, the exposed portions of protection layer 26 are removed. The wet etch process will also remove hard mask layer 14 underlying protection layer 26, if extant, and possibly the top portion of the sidewall spacers. The resulting structure is shown in FIGS. 5a and 5b.

Figure 5A:
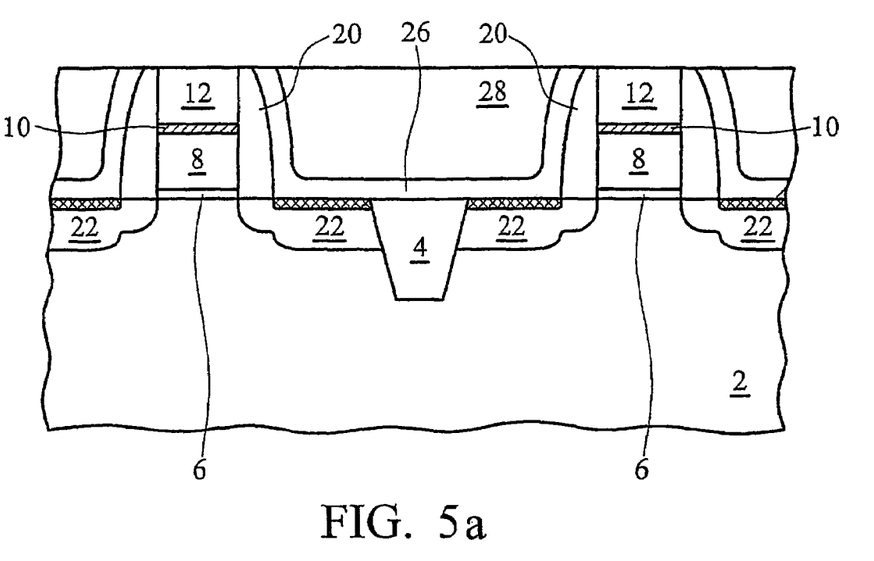
Figure 5B:
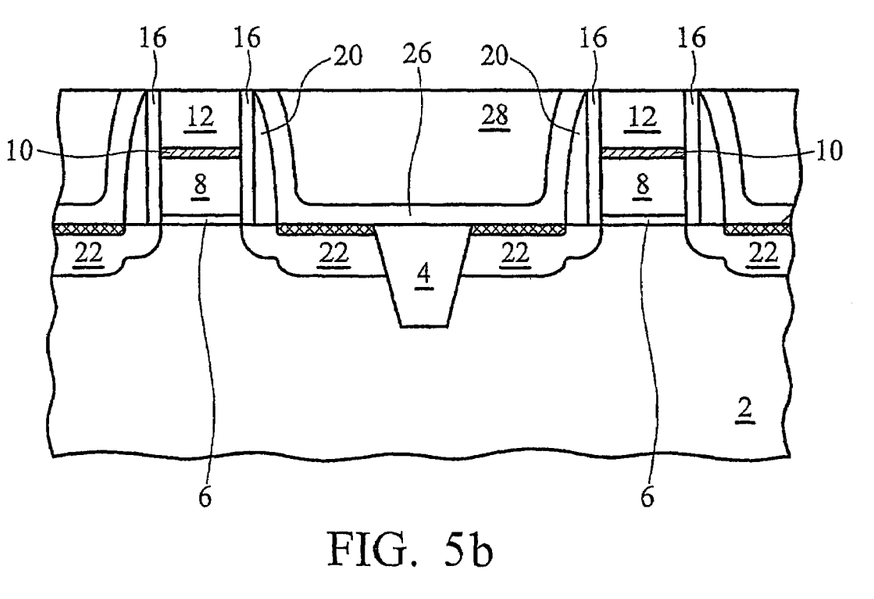

With reference to FIGS. 5a and 5b, it is seen that silicon layer 12 is now exposed, whereas the remaining portions of the structures are covered by photoresist 28 and/or protection layer 26. FIGS. 5a and 5b illustrate an ideal situation wherein the etch selectivity relative to underlying silicon layer 12 and spacer 20 is near perfect and no over-etching of layer 12 occurs. In actual practice, it is likely that layer 12 will be etched somewhat during the removal of hard mask 14 and protection layer 26, resulting in a slight recess in layer 12 (not shown). This recess is of no consequence, however, as layer 12 is removed, as described below. Photoresist 28 is then removed. Next, using an appropriate etch process such as dry etching or wet etching, silicon layer 12 can be removed from the respective gate stacks. In embodiments wherein layer 12 is formed of Si—Ge, this layer could be removed by wet etching. Because of etch selectivity, the etch process stops on etch stop layer 10. At this juncture, etch stop layer 10 can be removed, again using an etch process appropriate to the etch stop layer 10 material, such as wet etching. It is during this process that the role of sealing spacers 16 (FIG. 5b) come into play. Because etch stop layer 10 is typically of the same or similar material as sidewall spacers 20, the etchant will have relatively low selectivity between the two features. Sidewall spacers 20 are exposed in FIG. 5a and may suffer some damage during the etch of etch stop layer 10. This damage can be minimized, however, by keeping etch stop layer 10 as thin as possible, while still performing its function. By contrast, sidewall spacers 20 of FIG. 5b are protected from damage by sealing spacers 16 and, hence, are unlikely to be damaged during the removal of etch stop layer 10.

Figure 6A:
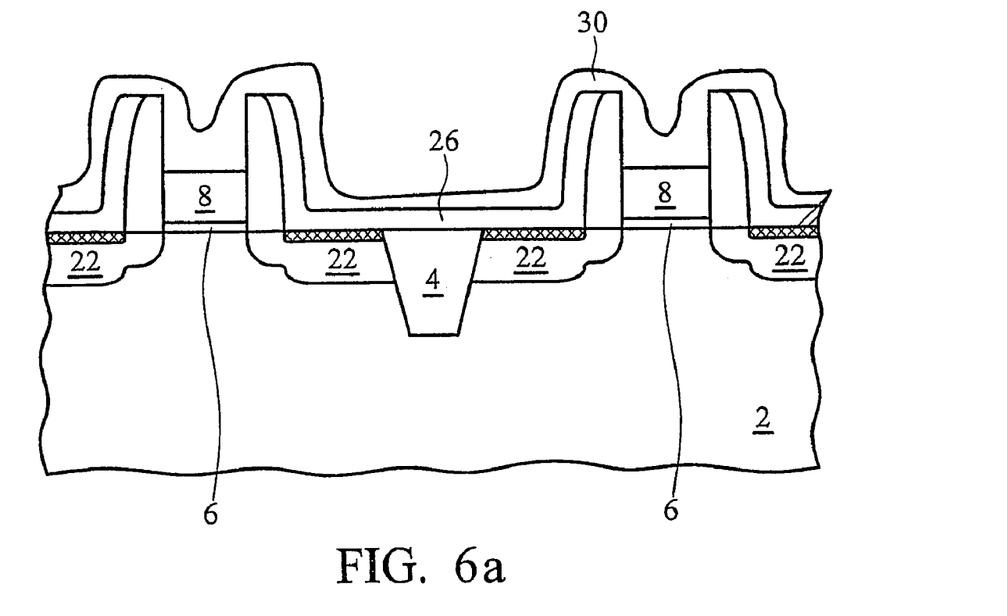
Figure 6B:
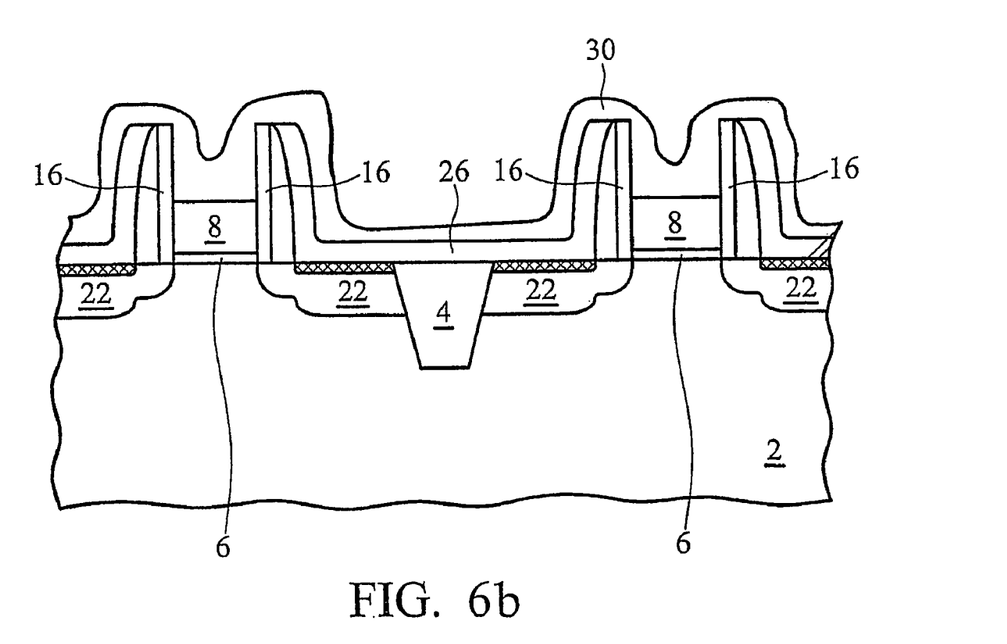

FIGS. 6a and 6b illustrate the resulting structure after polysilicon layer 12 and etch stop layer 10 have been removed, and after metal layer 30 has been deposited over the structure. In an illustrative embodiment, metal layer 30 is nickel, deposited using conventional techniques such as sputtering to a thickness of from about 200 Å to about 2000 Å. In other embodiments, metal 30 could comprise cobalt, copper, molybdenum, titanium, tantalum, tungsten, erbium, zirconium, platinum, Ytterbium or a combination thereof. Other metals are within the contemplated scope of the invention as well.

Figure 7A:
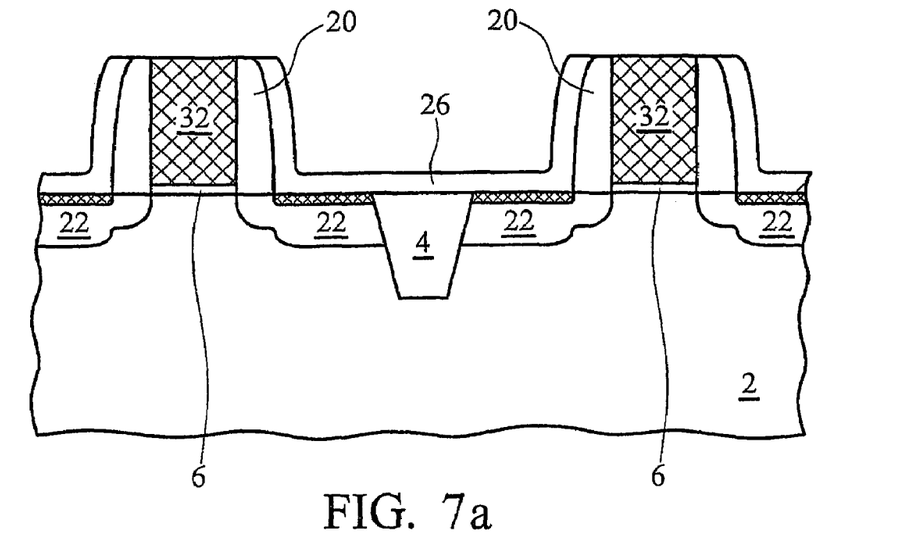
Figure 7B:
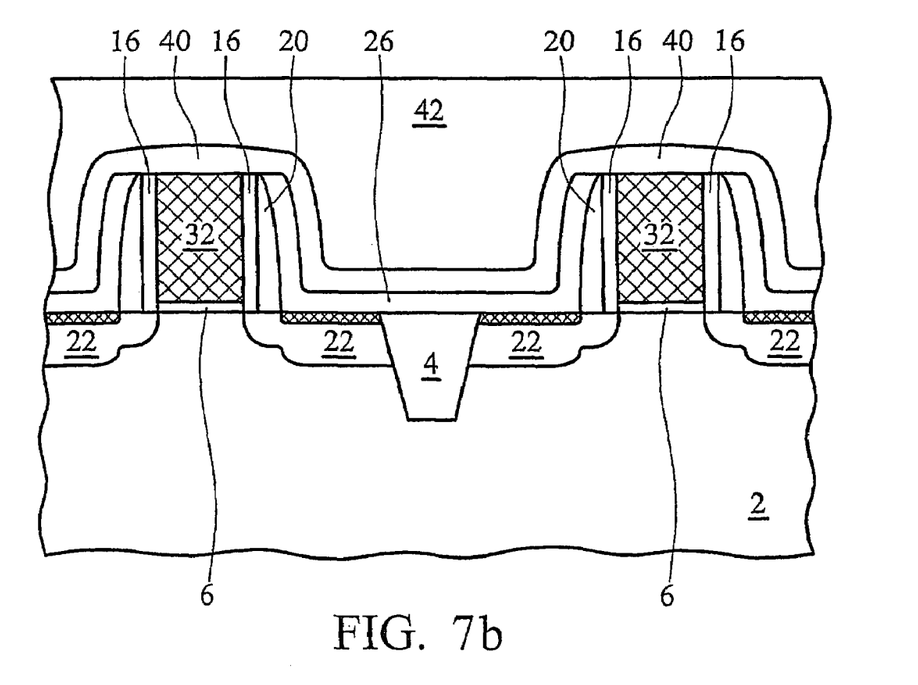

FIGS. 6a and 6b illustrate a significant design factor in the illustrative embodiments. On the one hand, the thinner polysilicon layer 8 is, the less thermal budget is required to fully suicide the gate. This design criteria argues for a polysilicon layer that is quite thin. On the other hand, the thinner polysilicon layer 8 is the higher the aspect ratio of the recess between sidewall spacers 20 that must be filled with metal layer 30. If the aspect ratio becomes too high, there is a risk of incomplete metal deposition in the recess and, hence, insufficient metal 30 in contact with polysilicon layer 8 for satisfactory silicidation, as will be described below. In illustrative embodiments, polysilicon layer 8 is designed to occupy about one third of the gate stack height as a minimum to about eighty percent of the gate stack height as a maximum. These are guidelines, however, and this range could be increased as processing and materials develop to allow for greater flexibility in the manufacturing process. The height of the gate stack is not shown in FIGS. 6a and 6b because these figures illustrate an intermediate state of manufacture wherein the gate stack has not yet been fully manufactured. The full gate stack is illustrated in FIGS. 7a and 7b. As explained above in Paragraph [0015], the stack height is equivalent to the total thickness of the layers comprising the stack.

A rapid thermal anneal (RTA) or other thermal process step is then performed to cause metal layer 30 to interact with underlying polysilicon layer 8 and form a fully silicided gate electrodes 32, as shown in FIG. 7a. Another advantageous feature of the reduced height polysilicon layer 8 is that such a structure reduces the risk of non-uniform dispersal of the nickel (or other) metal in the polysilicon layer. As the nickel is driven down into the silicon from the top of the layer, a silicon rich phase may be formed at the top portion of the resulting silicide layer and a less silicon rich, even a nickel less, layer may be formed at the bottom of the resulting silicide layer. With a thinner polysilicon layer 8, the nickel need not be driven as deep and, hence, the relative concentration will be more uniform throughout. This also lessens the thermal budget constraints compared to conventional processes and structures.

After the silicidation step, the remaining metal layer 30 which does not interact with layer 8 is removed. Protection layer 26 can also be removed, or optionally, protection layer 26 can be left on the structure and serve as, at least part of, a contact etch stop layer (CESL). Contact etch stop layer 40 may be deposited as shown in FIG. 7b and inter-layer dielectric (ILD) 42 is subsequently formed, followed by a series of one more metal interconnection layers (not shown) separated by one or more inter-metal dielectric (IMD) layers (not shown) for completing the integrated circuit.

An advantageous feature of embodiments of the present invention is that the embodiments lessen the critical dimension (CD) dependency on gate width. It is known that the silicidation process occurs more rapidly in a narrow gate, due to the larger surface area to bulk ratio, relative to a wide gate. Hence, silicidation process control is dependent upon gate width. This puts constraints on circuit design wherein relatively wide gates might not be fully silicided in the time required to fully silicide relatively narrow gates. By decreasing the polysilicon layer height, the affects of gate height on the silicidation process are lessened.

Figure 8:
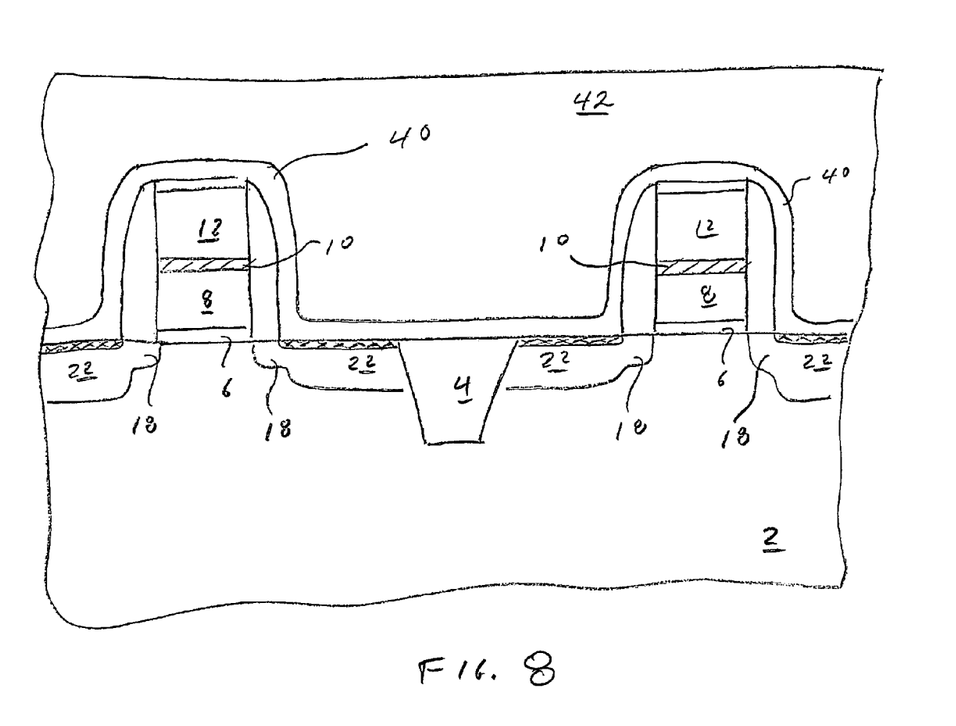
FIGS. 8a and 8b illustrate in cross-sectional view intermediate steps in a second illustrative method of forming a fully silicided gate electrode.
Figure 9:
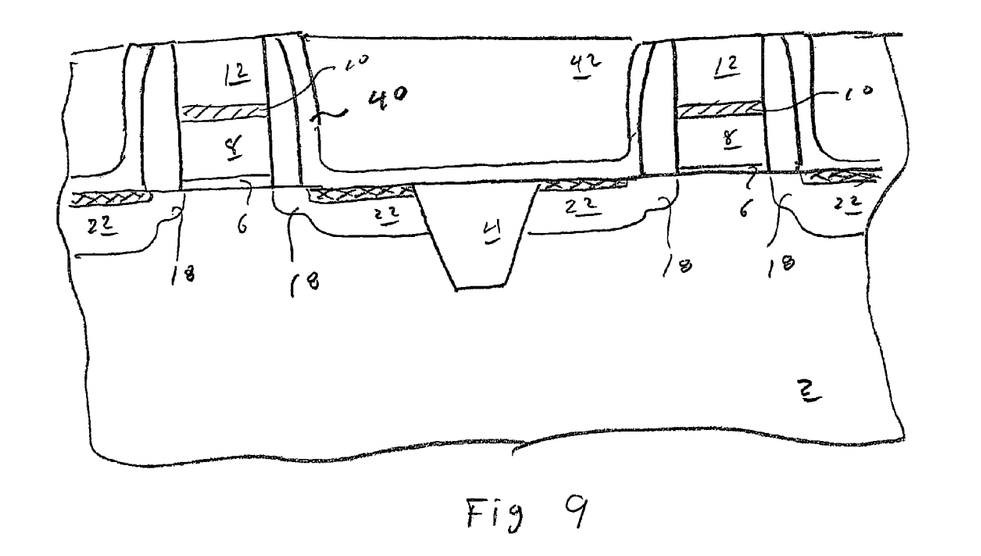

Another illustrative embodiment is illustrated with reference to FIGS. 8a and 8b. CESL 40 is illustratively silicon nitride deposited by CVD or PECVD. Inter-layer dielectric (ILD) 42 is then deposited over the device, also as shown in FIG. 8a. ILD 42 is illustratively spun-on-glass (SOG), high density plasma oxide, and the like. Note that protection layer 26 is removed prior to depositing CESL 40 in the embodiment illustrated in FIG. 8.

As illustrated in FIG. 8b, ideal etch processes could lead the etching process to stop on gate electrode, and contact stop layer could then be removed with enough process margin (due to high etching selectivity of silicide compared to ILD oxide). In some cases, ILD layer 42 is then subjected to a chemical mechanical polish (CMP) process in which the top surface of ILD layer is planarized and lowered. CMP processing continues when the top surface of CESL 40 is reached and the portions of CESL 40 overlying the gate stacks are removed as well. Likewise, CMP processing continues with the removal of hard mask layer 14, assuming same is still extant on the respective polysilicon stacks. After CMP processing, the resulting structure is illustrated in FIG. 8b, wherein polysilicon layer 12 is exposed on the respective gate stacks. Processing can then continue much as described above with reference to FIGS. 5 through 7. Polysilicon layer 12 is removed, followed by removal of etch stop layers 10. Metal layer 30 is next deposited on the respective stacks and reacted with the underlying polysilicon layer 8. Excess, unreacted metal is then removed, and processing can continue with the formation of additional ILD material, formation of contacts in the ILD layer, and connection with subsequently formed metal interconnects, as are known in the art. Note that this embodiment uses the CESL and the ILD layers that are ordinarily formed as part of the standard CMOS process flow to expose the polysilicon layer 12 while protecting the rest of the device. This embodiment eliminates the need for additional protection layer 26 and photoresist layer 28. Hence, this embodiment may simplify the process flow.

Embodiments and advantageous features of the invention include a transistor comprising a substrate; a gate dielectric on the substrate; a substantially fully silicided polysilicon gate electrode on the gate dielectric; a silicon nitride sealing spacer lining a sidewall of the gate electrode and physically contacting the gate electrode; and a gate spacer adjacent the silicon nitride sealing spacer. The transistor may include a source/drain region formed in the substrate adjacent the gate electrode and having at least a portion of a top surface silicided, and wherein the silicided top portion is of a different composition than the gate electrode silicide. Another advantageous embodiment may include a transistor comprising a substrate; a gate dielectric on the substrate; a substantially fully silicided polysilicon gate electrode on the gate dielectric; a gate spacer adjacent the gate electrode and gate dielectric; and a source/drain region formed in the substrate adjacent the gate electrode and having at least a portion of a top surface silicided, and wherein the silicided top portion is of a different composition than the gate electrode silicide. The transistor may be one wherein the substrate and the source/drain region are formed of different materials. The transistor may be one wherein the source/drain region is formed of silicon germanium (Si—Ge).

Yet another advantageous feature and embodiment may be an integrated circuit comprising: a first transistor formed in a first region of a substrate and including: a first gate dielectric on the substrate; a first substantially fully silicided polysilicon gate electrode having a first thickness on the first gate dielectric; and a first gate spacer adjacent the first gate electrode and first gate dielectric. The integrated circuit further includes a second transistor formed in a second region of the substrate and including: a second gate dielectric on the substrate; a second substantially fully silicided polysilicon gate electrode having a second thickness on the second gate dielectric; and a second gate spacer adjacent the second gate electrode and second gate dielectric. The integrated circuit of claim F further comprising a first source/drain region formed in the substrate adjacent the first gate electrode and having at least a portion of a top surface silicided, and wherein the silicided top portion is of a different composition than the first gate electrode silicide; and a second source/drain region formed in the substrate adjacent the second gate electrode and having at least a portion of a top surface silicide, and wherein the silicided top portion of the second source/drain region is of a different composition than the second gate electrode silicide. In some embodiments, the integrated circuit the first transistor is an NMOS and the second transistor is an PMSO. In some embodiments, the first source/drain region is a different material than the substrate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a device comprising:
   forming a gate electrode stack including a first silicon-containing layer and a second silicon-containing layer with an intervening etch stop layer, wherein a height of the first silicon-containing layer is at least one third of a height of the gate electrode stack;
   removing the second silicon-containing layer and the intervening etch stop layer; and
   reacting the first silicon-containing layer with a metal to silicide the first silicon-containing layer.

2. The method of claim 1 further comprising:
   forming source and drain regions on opposite sides of the gate electrode stack; and
   siliciding at least portions of respective top surfaces of the source and drain regions in a different process step than the reacting step.

3. The method of claim 1 wherein the reacting step comprises performing a rapid thermal anneal (RTA).

4. The method of claim 1 further comprising forming sealing spacers on sidewalls of the gate electrode stack.

5. The method of claim 4 further comprising forming gate spacers on the sealing spacers.

6. The method of claim 2 wherein forming source and drain regions includes implanting impurities into a substrate on which the gate electrode stack is formed.

7. The method of claim 2 wherein forming source and drain regions includes epitaxially growing the source and drain regions in a substrate on which the gate electrode stack is formed.

8. The method of claim 1 further comprising:
   forming a second polysilicon stack including a third polysilicon layer and a fourth polysilicon layer with an intervening second etch stop layer, wherein a height of the third polysilicon layer is at least one third a height of the second polysilicon stack height;
   removing the fourth polysilicon layer and the second intervening etch stop layer; and
   reacting the third polysilicon layer with a second metal to substantially fully silicide the third polysilicon layer.

9. The method of claim 8 wherein the first metal and the second metal are different metals.

10. A method of forming a transistor comprising:
    forming on a substrate a gate stack including a gate dielectric, a first polysilicon layer, an etch stop layer, and second polysilicon layer, wherein the first polysilicon layer has a height of about one third to about eighty percent of the gate stack height;
    forming at least partly in the substrate source and drain regions, respectively, on opposite sides of the gate stack;
    siliciding at least a portion of a top surface of the source and drain regions;
    covering the source and drain regions and exposing a top surface of the gate stack;
    removing the second polysilicon layer and the etch stop layer; and
    substantially fully siliciding the first polysilicon layer.

11. The method of claim 10 further comprising:
    forming a sealing spacer on the gate stack.

12. The method of claim 10 wherein covering the source and drain regions and exposing a top surface of the gate stack comprises:
    forming a protection layer over the gate stack and over the source and drain regions;

forming a masking layer over the protection layer;
etching back the masking layer to be planar with a top surface of the protection layer;
etching back the etching layer to expose the top surface of the gate stack.

13. The method of claim 10 wherein the gate stack further comprises a hard mask layer on the second polysilicon layer.

14. The method of claim 10 wherein covering the source and drain regions and exposing a top surface of the gate stack comprises:
    forming a contact etch stop layer (CESL) over the gate stack and over the source and drain regions;
    forming an inter-layer dielectric (ILD) over the CESL; and
    performing a chemical mechanical polish (CMP) to remove the ILD and the CESL from a top surface of the gate stack.

15. The method of claim 14 further including:
    forming contact openings in the ILD and CESL; and
    filling the contact openings with conductors, one of the conductors electrically contacting the silicided first polysilicon layer.

16. A method of forming a device comprising:
    forming a gate electrode on a substrate, the gate electrode comprising a first sub-layer and a second sub-layer atop the first sub-layer and wherein the first sub-layer has high etch selectivity relative the second sub-layer;
    forming a pair of spacers adjacent to opposite sidewalls of the gate electrode, wherein a height of the gate electrode is at least one third a height of the spacers;
    forming a metal layer over the gate electrode; and
    forming a silicide by reacting the gate electrode with the metal layer.

17. The method of claim 16 wherein forming a gate electrode further comprises:
    forming a gate dielectric layer on a substrate;
    forming a first polysilicon layer on the gate dielectric layer, wherein the first polysilicon layer is between about one third and eighty percent of a nominal height of a gate stack;
    forming an etch stop layer on the first polysilicon layer;
    forming a second polysilicon layer on the etch stop layer;
    forming a hard mask on the second polysilicon layer;
    patterning the hard mask, the second polysilicon layer, the etch stop layer, the first polysilicon layer, and the gate dielectric to form a polysilicon stack;
    substantially covering the polysilicon stack;
    exposing a top surface of said polysilicon stack;
    removing the second polysilicon layer; and
    removing the etch stop layer.

18. The method of claim 17 wherein substantially covering the polysilicon stack includes forming a relatively thin protection layer and a relatively thick photoresist layer over the polysilicon stack.

19. The method of claim 18 wherein exposing a top surface includes ashing the relatively thick photoresist layer to remove a portion of the relatively thick photoresist layer and wet etching the relatively thin protection layer, and removing photoresist after wet etching.

20. The method of claim 17 further comprising:
    forming a sealing spacer on sidewalls of the polysilicon stack.

* * * * *